(12) United States Patent
Erb et al.

(10) Patent No.: US 6,756,303 B1
(45) Date of Patent: Jun. 29, 2004

(54) DIFFUSION BARRIER AND METHOD FOR ITS PRODUCTION

(75) Inventors: Darrell M. Erb, Los Altos, CA (US); Fei Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/334,361

(22) Filed: Dec. 30, 2002

Related U.S. Application Data

(60) Provisional application No. 60/400,283, filed on Jul. 31, 2002.

(51) Int. Cl.[7] .............................................. H01L 21/44
(52) U.S. Cl. ........................ 438/659; 257/750; 257/752; 438/653
(58) Field of Search ................................ 257/750, 752; 438/652, 653, 657, 659

(56) References Cited

U.S. PATENT DOCUMENTS 5,118,636 A * 6/1992 Hosaka ....................... 438/421
5,278,438 A * 1/1994 Kim et al. ................... 257/316
5,498,564 A * 3/1996 Geissler et al. ............. 438/247
6,107,153 A * 8/2000 Huang et al. ............... 438/389

FOREIGN PATENT DOCUMENTS

JP          03087023 A  *  4/1991    .......... H01L/21/265

* cited by examiner

Primary Examiner—Allan R. Wilson
(74) Attorney, Agent, or Firm—Foley & Lardner LLP

(57) ABSTRACT

A conductive diffusion barrier surrounding a conductive element is enhanced by an implanted diffusion barrier enhancing material. The enhancing material is implanted using a low energy implant at an angle to the substrate, such that the portion of the diffusion barrier at the bottom of the conductive element is protected during implantation. This prevents the increased resistivity caused by the enhancing material from affecting the conductive path between the conductive element and another conductive element. The diffusion barrier is preferably titanium nitride (TiN) and the enhancing material is preferably silicon (Si).

8 Claims, 6 Drawing Sheets

DIFFUSION BARRIER AND METHOD FOR ITS PRODUCTION

RELATED APPLICATIONS

This application claims priority under 35 U.S.C. § 119(e) from U.S. Provisional Patent Application Serial No. 60/400,283, filed Jul. 31, 2002.

BACKGROUND OF THE INVENTION

1. Field of the Invention

Preferred embodiments of the invention pertain to the prevention of diffusion of copper into a surrounding dielectric in an integrated circuit.

2. Related Technology

Integrated circuits (ICs) are manufactured by forming discrete semiconductor devices such as MOSFETS and bipolar junction transistors on a semiconductor substrate, and then forming a back end metal wiring network that connects those devices to create circuits. The wiring network is composed of individual metal wires called interconnects that generally lay parallel to the plane of the substrate. Interconnects are connected to the semiconductor devices by vertical contacts and are connected to other interconnects by vertical vias. A typical wiring network employs multiple levels of interconnects and vias.

The performance of integrated circuits is determined in large part by the conductivity and capacitance of the wiring network. Copper (Cu) has been adopted as the preferred metal for wiring networks because of its low resistivity compared to other conventional metals such as tungsten (W) and aluminum (Al), and because of its low cost compared to other low resistivity metals such as silver (Ag) and gold (Au). High quality Cu is also easily formed by damascene (inlay) processing using wet plating techniques such as electroplating or electroless plating followed by annealing.

Although Cu provides the aforementioned desirable features, it also has detrimental characteristics that must be addressed in order to produce functional products. One problem with Cu is its tendency to diffuse into surrounding semiconductor and insulating substrate materials. This diffusion degrades the semiconductive or insulative properties the surrounding material, and also affects the adhesion of the copper to the substrate. As a result, it is now conventional to provide a diffusion barrier between the copper and surrounding material. FIG. 1 shows an example of a conventional copper via 10. The via is formed in a substrate that includes an interlevel dielectric (ILD) layer 12. The via 10 is inlaid in a trench that extends through the ILD 12 to contact an underlying conductive element 14 such as an interconnect. The copper material of the via 10 is surrounded by a diffusion barrier 16 that is formed as a conformal layer over the substrate to line the trench prior to inlaying of the via material. The diffusion barrier 16 prevents diffusion of copper from the via 10 into the surrounding ILD material 12. Conventional Cu diffusion barrier materials include titanium (Ti), titanium nitride (TiN), tungsten (W), chromium (Cr), tantalum (Ta), and tantalum nitride (TaN). The substrate and the upper surface of the via are protected by a passivation material 18, which is typically a layer of dielectric material such as silicon nitride (SiN) that covers the entire substrate. In some instances, selectively deposited metal is used as a passivation material.

The barrier materials listed above are preferred over other diffusion barrier materials such as SiN because they are conductive and may therefore be located in the conductive path of the conductive element. For example, referring to FIG. 1, the conformally deposited diffusion barrier 16 may be left at the bottom of the trench between the via 10 and the interconnect 14 because it is able to conduct current between those two elements, whereas an insulating barrier material such as SiN would have to be removed from the bottom of the trench prior to formation of the via 10 in order to provide a conductive path. Such removal requires masking of the substrate and exposing only the trench bottoms to an etching agent. Such processing is exacting and time consuming, and becomes more difficult as critical dimensions continue to shrink.

While conductive diffusion barriers are presently the preferred diffusion barrier materials, they do not provide as much diffusion protection as insulative barrier materials such as SiN. As critical dimensions continue to shrink, the thickness of diffusion barriers must also be reduced, however thinner diffusion barriers provide less protection against diffusion. Thus there is an incentive to enhance the diffusion protection provided by conventional conductive barrier materials, for example, TiN may be enhanced by doping with silicon (Si). However, such enhancing materials tend to increase the resistance of the diffusion barrier, leading to the problems discussed above regarding insulating diffusion barriers.

SUMMARY OF THE INVENTION

In accordance with a preferred embodiment of the invention, a conductive diffusion barrier is doped with one or more diffusion barrier enhancing materials through a low energy implantation process. The implantation is performed at an angle with respect to the broad surface of the substrate so that the sidewalls of the trench protect the bottom of the trench from being implanted. In this manner, the barrier properties of the sidewalls are enhanced, and the conductive properties of the barrier at the bottom of the trench are not degraded. This processing may be performed with any conventional trench structure such as a via, an interconnect, or a dual damascene structure. Any of a variety of conductive barrier materials and any of a variety of barrier enhancement materials may be employed.

In accordance with another preferred embodiment of the invention, a conductive element in the back end wiring network of an integrated circuit is surrounded by a diffusion barrier. The diffusion barrier is comprised of a conductive diffusion barrier material. The sidewall portion of the diffusion barrier is comprises the conductive diffusion barrier material and a diffusion barrier enhancing material, while the bottom of the diffusion barrier comprises the conductive diffusion barrier material but not the diffusion barrier enhancing material.

DESCRIPTION OF THE DRAWINGS

Preferred embodiments will hereafter be described with reference to the accompanying drawings, wherein like numerals denote like elements.

DETAILED DESCRIPTION OF PREFERRED EMBODIMENTS

Figure 1:
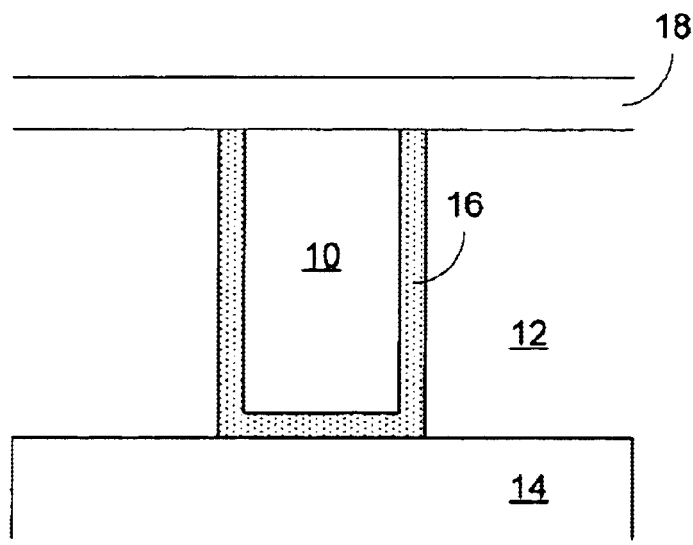
FIG. 1 shows the diffusion barrier structure of a conventional conductive element.
Figure 2A:
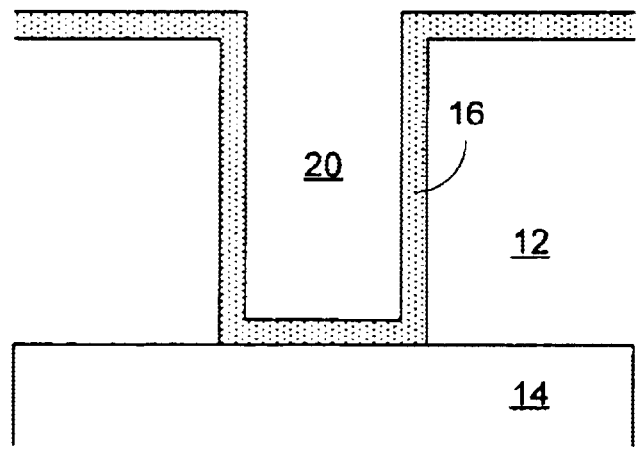
FIGS. 2a, 2b, 2c and 2d show structures formed during the course of a single inlay process in accordance with a preferred embodiment of the invention.

FIGS. 2a, 2b, 2c and 2d show structures formed during the course of a single inlay process in accordance with a preferred embodiment of the invention. FIG. 2a shows a conventional structure formed during a single inlay process. The structure comprises a substrate that includes an inter-level dielectric (ILD) layer 12. A via trench 20 is formed in the ILD 12 to a depth sufficient to expose an underlying interconnect 14. The ILD 12 is covered with a conformal layer of a TiN diffusion barrier 16 that lines the trench.

Figure 2B:
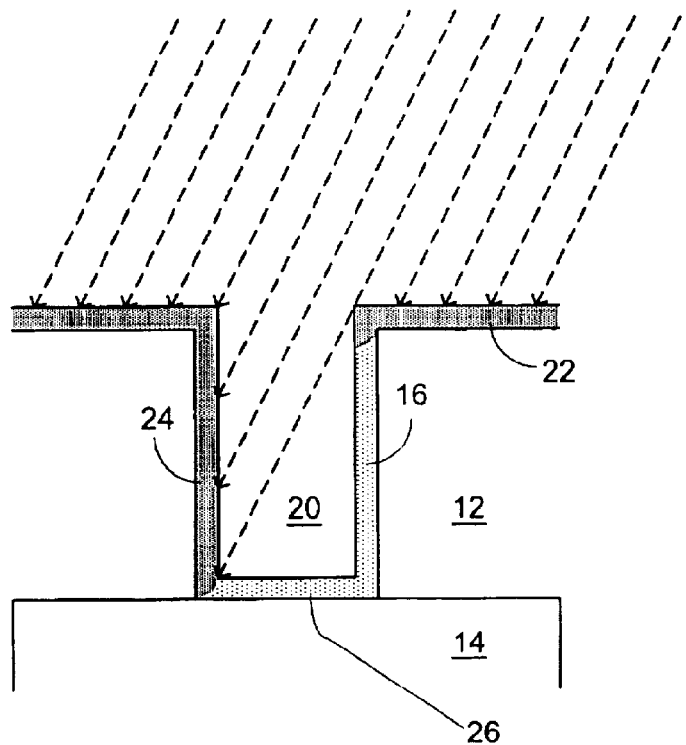

FIG. 2b shows the structure of FIG. 2a during implantation in accordance with a preferred embodiment of the invention. In this preferred embodiment, the TiN diffusion barrier is selectively implanted with Si in the sidewalls to enhance the diffusion resistance of the sidewalls. This is accomplished by a low energy implantation that is performed at an angle with respect to the broad surface of the substrate. As shown in FIG. 2b, this angle is chosen such that the sidewalls nearest the implantation source shield the bottom of the trench from implantation. As a result, top surface portions 22 and sidewall portions 24 of the diffusion barrier are implanted with Si, while the bottom surface remains unimplanted and thus retains higher conductivity.

Implantation is typically performed by an implantation device that provides computer controlled tilting and rotation of the substrate. In one embodiment the substrate is rotated at high speed while tilted to provide uniform exposure of all sidewalls to the ion field. In alternative embodiments the substrate may be rotated among a plurality of stationary positions and exposed for a period of time at each position to provide approximately even exposure of all trench sidewall surfaces.

Figure 2C:
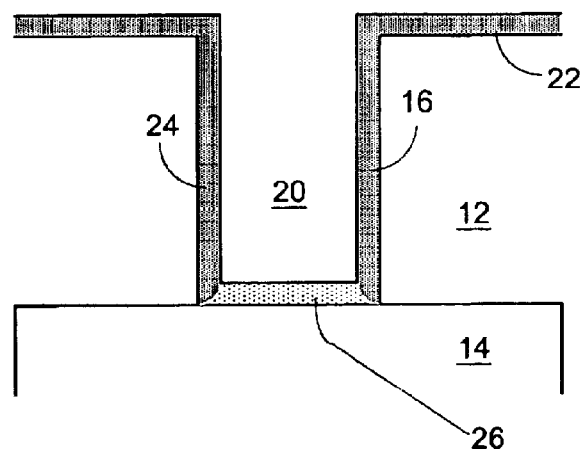
Figure 2D:
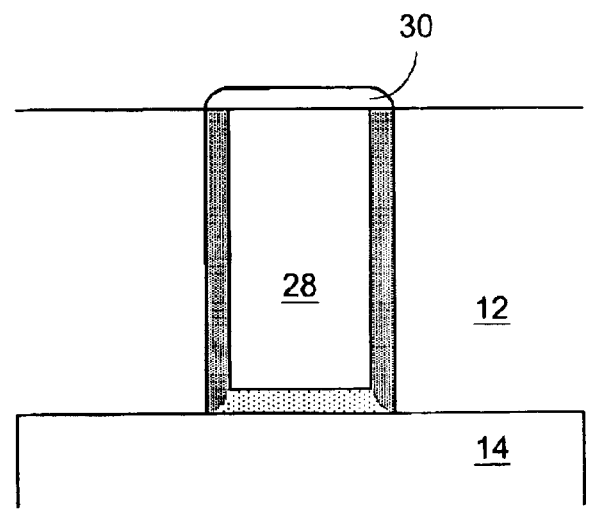

FIG. 2c shows the structure of FIG. 2b after implantation. In this structure, all of the top surface portions 22 and sidewall portions 24 of the diffusion barrier are implanted with Si, while the bottom portion 26 of the diffusion barrier remains unimplanted. FIG. 2d shows the structure of FIG. 2c after formation of a copper via 28, such as by a wet plating process, followed by chemical mechanical polishing to remove an overburden portion of the bulk copper and diffusion barrier, and selective deposition of a metal passivation layer 30 on the upper surface of the via 28. As seen in FIG. 2d, the diffusion barrier 16 is enhanced in those portions that separate the via 28 from the surrounding ILD 12, while it remains unenhanced, and thus more conductive, in those portions that separate the via 28 from the underlying interconnect 14.

The processing of the aforementioned first preferred embodiment may be applied in an analogous manner to diffusion barriers of trenches in which interconnects are to be formed. Likewise, the aforementioned processing may be applied in an analogous manner to diffusion barriers of dual damascene structures, as illustrated in FIGS. 3a–3d.

Figure 3A:
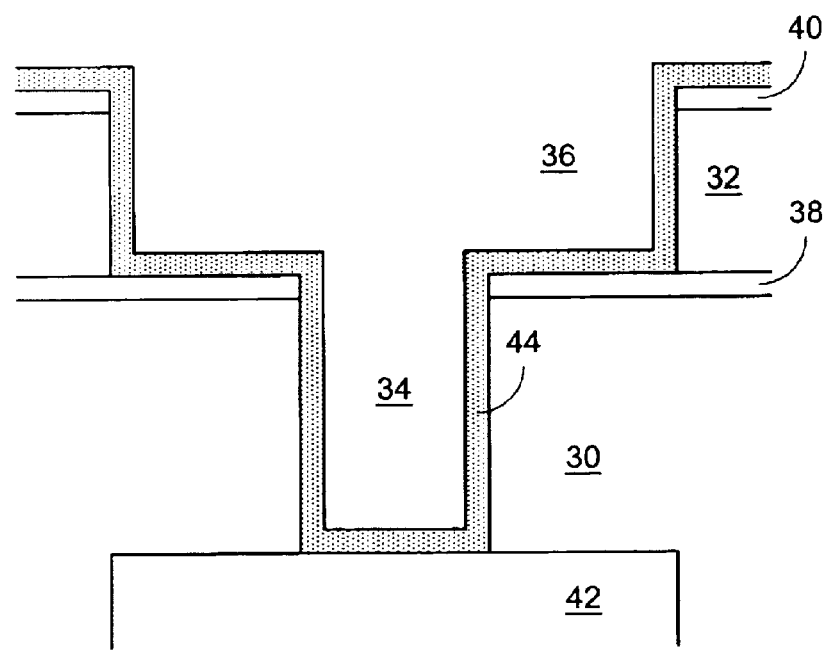
FIGS. 3a, 3b, 3c and 3d show structures formed during the course of a dual damascene process in accordance with a preferred embodiment of the invention.

FIG. 3a shows a conventional dual damascene structure formed during a dual inlay process. The structure comprises a substrate that includes lower and upper ILD layers 30, 32. A dual damascene trench having a lower portion 34 defining a via and an upper portion 36 defining an interconnect is formed in the ILD layers 30, 32 by etching using lower and upper hardmask layers 38, 40 to define the boundaries of the lower and upper portions 34, 36. The lower portion 34 of the trench is etched sufficiently far down to expose an underlying interconnect 42. The substrate is covered with a conformal layer of TiN 16 that lines the inside of the trench and serves as a diffusion barrier.

Figure 3B:
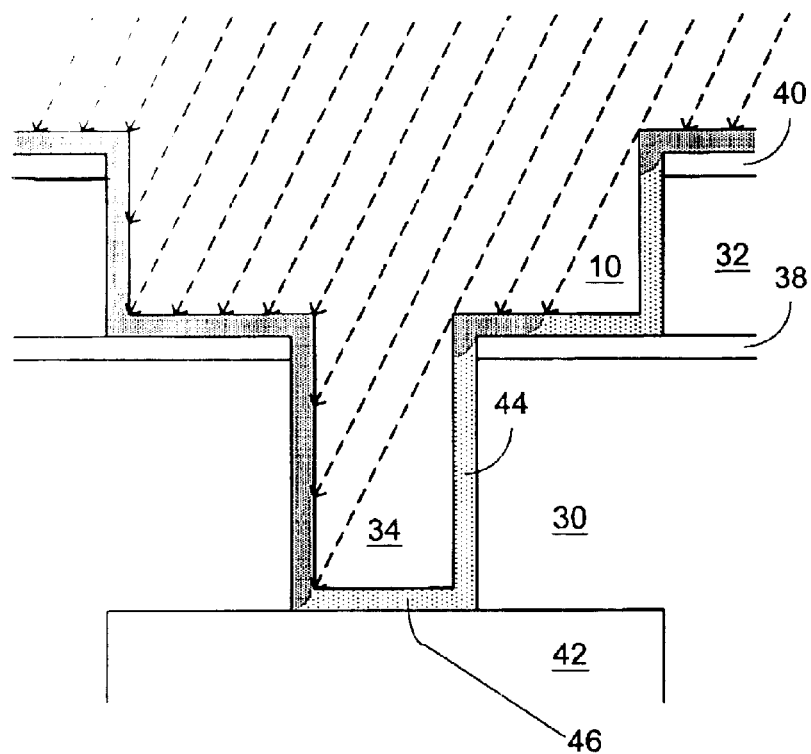

FIG. 3b shows the structure of FIG. 3a during selective implantation of Si into the sidewalls of the TiN diffusion barrier to enhance the diffusion resistance of the sidewalls. As in the first preferred embodiment, a low energy implantation is performed at an angle with respect to the broad surface of the substrate that is chosen such that the sidewalls nearest the implantation source protect the bottom 46 of the trench from implantation. Note that in this embodiment it is permissible to implant the horizontal portions of the diffusion barrier 44 in the upper portion 36 of the trench, since those portions of the diffusion barrier are not in the conductive path. Thus the angle of implantation is preferably chosen so that only the bottom-most portion 46 of the diffusion barrier 44 is shielded by the surrounding sidewalls. The implantation may be performed using continuous rotation or by rotating among a plurality of stationary positions as described above.

Figure 3C:
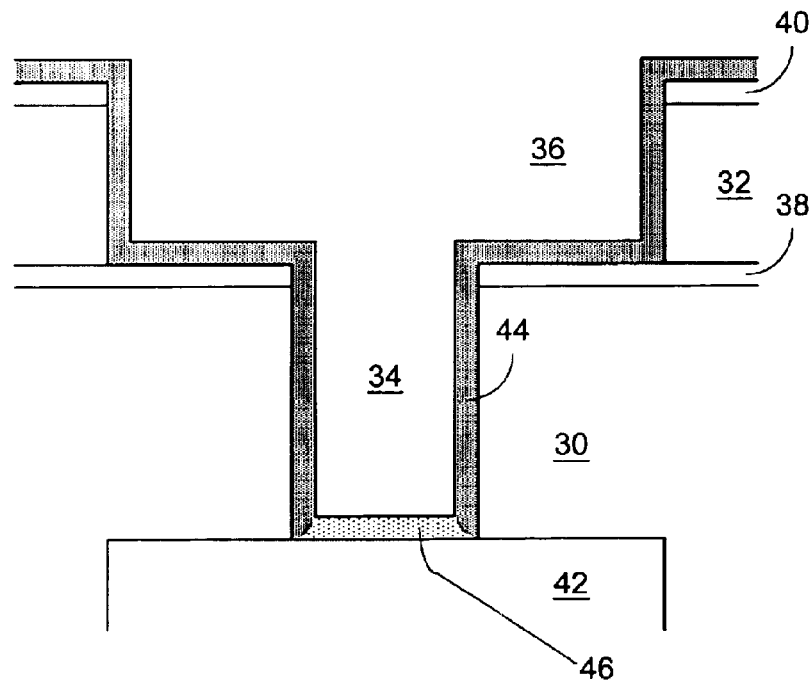
Figure 3D:
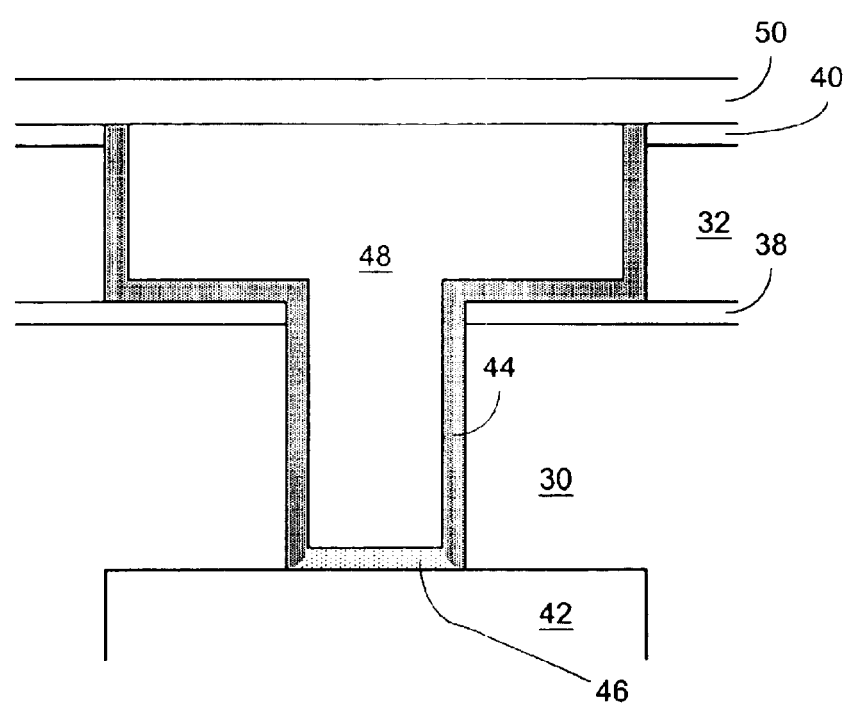

FIG. 3c shows the structure of FIG. 3b after implantation. In this structure, all of the diffusion barrier apart from the bottom portion 46 at the bottom of the trench are implanted with Si. FIG. 3d shows the structure of FIG. 2c after formation of a copper dual damascene conductive element 48, such as by a wet plating process, followed by chemical mechanical polishing to remove an overburden portion of the bulk copper and diffusion barrier, and formation of a passivation layer 50 on the upper surface of the conductive element 48. As seen in FIG. 3d, the diffusion barrier 44 is enhanced in those portions where it separates the conductive element 48 from the surrounding ILD 30, while it remains unenhanced, and thus more conductive, in those portions that separate the conductive element 48 from the underlying interconnect 42.

Although the preferred embodiments employ a diffusion barrier of TiN that is enhanced with implanted Si, a variety of other barrier materials and enhancement materials may be employed.

Figure 4:
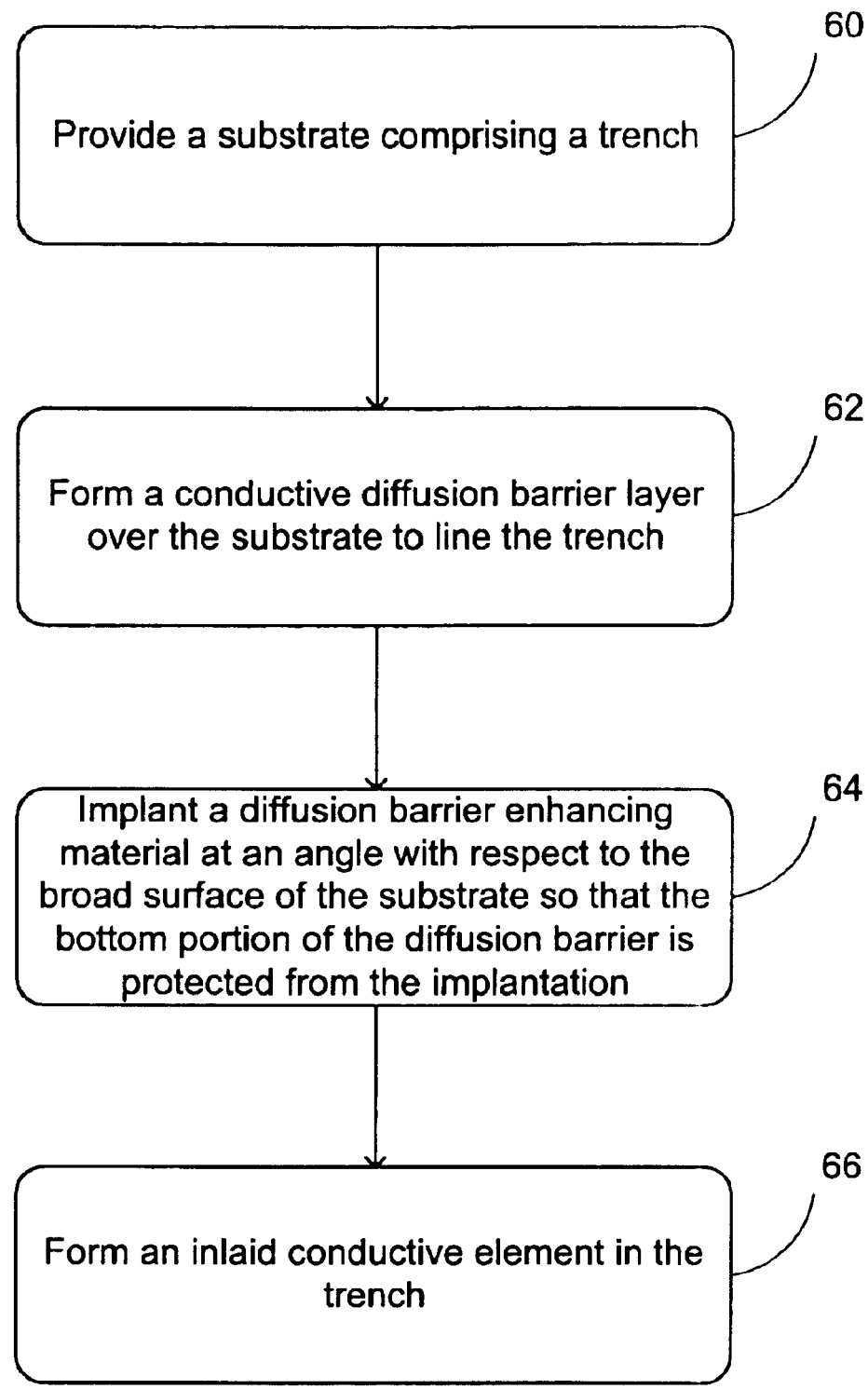
FIG. 4 shows a basic process flow encompassing the preferred embodiments and alternative embodiments.

FIG. 4 shows a process flow diagram encompassing the preferred embodiments of FIGS. 2a–2d and 3a–3d, as well as the aforementioned alternative embodiments and other alternative embodiments not specifically discussed. Initially a substrate having a trench is provided (60). The trench typically defines the shape of an interconnect, a via, or a dual damascene structure. A conductive diffusion barrier is then formed over the substrate to line the trench (62). The diffusion barrier is preferably formed of TiN but may be of a variety of other materials. A diffusion barrier enhancing material is then implanted into the diffusion barrier at an angle with respect to the broad surface of the substrate so that the bottom portion of the diffusion barrier is protected from the implantation (64). The enhancing material is preferably Si but may be of a variety of other materials. Subsequently an inlaid conductive element is formed in the trench (66). The conductive element is preferably copper, but may comprise further materials such as alloying elements, or may be formed of another material. The conductive element is preferably formed by a wet plating process, followed by polishing to remove an overburden portion, and formation of a passivation layer over at least the conductive element.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as seed layer formation, seed layer enhancement, formation and removal of passivation layers or protective layers between processing tasks, formation and removal of photoresist masks and other masking layers, as well as other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope and spirit of the appended claims.

What is claimed is:

1. A method for forming a conductive element of an integrated circuit, comprising:

providing a substrate having a trench formed therein;

forming a conductive diffusion barrier over the substrate to line the trench;

implanting a diffusion barrier enhancing material into the substrate at an angle with respect to a broad surface of the substrate such that a bottom portion of the diffusion barrier is protected from the implantation; and forming an inlaid conductive element in the trench.

2. The method claimed in claim 1, wherein the diffusion barrier is titanium nitride (TiN) and the diffusion barrier enhancing material is silicon (Si).

3. The method claimed in claim 1, wherein the conductive element is copper (Cu).

4. The method claimed in claim 1, wherein said implanting comprises rotating the substrate continuously for a period during said implanting.

5. The method claimed in claim 1, wherein said implanting comprises rotating the substrate among a plurality of stationary positions during said implanting.

6. The method claimed in claim 1, wherein the conductive element is a via.

7. The method claimed in claim 1, wherein the conductive element is an interconnect.

8. The method claimed in claim 1, wherein the conductive element is a dual damascene structure.

* * * * *